US009079763B2

(12) United States Patent
Geisberger

(10) Patent No.: US 9,079,763 B2
(45) Date of Patent: Jul. 14, 2015

(54) MEMS DEVICE WITH STRESS ISOLATION AND METHOD OF FABRICATION

(71) Applicant: Freescale Semiconductor, Inc., Austin, TX (US)

(72) Inventor: Aaron A. Geisberger, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 206 days.

(21) Appl. No.: 13/867,656

(22) Filed: Apr. 22, 2013

(65) Prior Publication Data

US 2014/0312435 A1    Oct. 23, 2014

(51) Int. Cl.
*B81B 3/00* (2006.01)
*B81C 1/00* (2006.01)

(52) U.S. Cl.
CPC ........... *B81B 3/0072* (2013.01); *B81C 1/00666* (2013.01)

(58) Field of Classification Search
CPC ..................... B81B 3/0072; B81B 2203/0172; B81C 1/00666; B81C 1/00182
See application file for complete search history.

(56) References Cited

U.S. PATENT DOCUMENTS

| | | | |
|---|---|---|---|
| 6,121,552 A | 9/2000 | Brosnihan et al. | |
| 6,239,473 B1 | 5/2001 | Adams et al. | |
| 6,291,875 B1 | 9/2001 | Clark et al. | |
| 6,342,430 B1 | 1/2002 | Adams et al. | |
| 6,433,401 B1 | 8/2002 | Clark et al. | |
| 7,943,525 B2 | 5/2011 | Zhang et al. | |
| 8,056,415 B2 | 11/2011 | Mcneil et al. | |
| 8,138,007 B2 | 3/2012 | Geisberger | |
| 2005/0066728 A1 | 3/2005 | Chojnacki et al. | |
| 2008/0290430 A1 | 11/2008 | Mahadevan et al. | |
| 2011/0049648 A1* | 3/2011 | Geisberger | 257/415 |

OTHER PUBLICATIONS

Hao Luo et al., "A Post-CMOS Micromachined Lateral Accelerometer", Journal of Microelectromechanical Systems, Jun. 2002, pp. 188-195, vol. 11, No. 3, USA.
Jin Xie et al., "Compact Electrode Design for In-Plane Accelerometer on SOI with Refilled Isolation Trench", The Institute of Microelectronics, A *STAR (Agency for Science, Technology and Research), Jun. 5-9, 2011, pp. 76-79, IEEE 2011, Beijing, China.

* cited by examiner

*Primary Examiner* — Ermias Woldegeorgis

(57) ABSTRACT

A MEMS device (20) includes a proof mass structure (26) and beams (28, 30) residing in a central opening (32) of the proof mass structure (26), where the structure and the beams are suspended over a substrate (22). The beams (28, 30) are oriented such that lengthwise edges (34, 36) of the beams are beside one another. Isolation segments (38) are interposed between the beams (28, 30) such that a middle portion (40) of each of the beams is laterally anchored to adjacent isolation segments (38). The isolation segments (38) provide electrical isolation between the beams. The beams (28, 30) are anchored to the substrate (22) via compliant structures (61, 65) that isolate the beams from deformations in the underlying substrate. The compliant structures (61, 65) provide electrically conductive paths (96, 98) to the substrate (22) for the beams (28, 30) where the paths are electrically isolated from one another.

20 Claims, 6 Drawing Sheets

MEMS DEVICE WITH STRESS ISOLATION AND METHOD OF FABRICATION

TECHNICAL FIELD OF THE INVENTION

The present invention relates generally to microelectromechanical systems (MEMS) devices. More specifically, the present invention relates to a MEMS device with stress isolation and fabrication methodology for the MEMS device.

BACKGROUND OF THE INVENTION

Microelectromechanical Systems (MEMS) sensor devices are widely used in applications such as automotive, inertial guidance systems, household appliances, protection systems for a variety of devices, and many other industrial, scientific, and engineering systems. Such MEMS devices are used to sense a physical condition such as acceleration, pressure, or temperature, and to provide an electrical signal representative of the sensed physical condition. Capacitive-sensing MEMS sensor designs are highly desirable for operation in high gravity environments and in miniaturized devices, and due to their relatively low cost.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

The fabrication and packaging of MEMS device applications often uses various materials with dissimilar coefficients of thermal expansion. As the various materials expand and contract at different rates in the presence of temperature changes, the substrate as well as the active transducer layer of the MEMS device may experience stretching, bending, warping and other deformations due to the different dimensional changes of the different materials. Thus, significant thermal stress can develop during manufacture or operation. In addition, significant package stresses can result from soldering the packaged MEMS device onto a printed circuit board in an end application.

Many MEMS sensor device applications require smaller size and low cost packaging to meet aggressive cost targets. In addition, MEMS device applications are calling for increased sensitivity and continual improvements in output performance of such MEMS devices. The thermal and package stresses can impose substrate deformations that are not always predictable or consistent through the lifetime of a MEMS device product. Furthermore, substrate deformation induced by thermal and package stresses can cause changes in the sense signal, thus adversely affecting the output performance of the MEMS device.

Development efforts have focused on cancelling the effect of substrate deformations in order to improve output performance of the MEMS device. Some designs implemented to cancel the effect of substrate deformations can reduce the area efficiency of the MEMS device. Other development efforts entail increasing the mechanical sensitivity in order to reduce the percent change due to package stress. However, this technique can be limited by an increased risk of proof mass failures due to stiction.

An embodiment of the invention entails a microelectromechanical systems (MEMS) transducer, referred to herein as a MEMS device, in which the MEMS device is largely separated from the underlying substrate. This separation is achieved by a configuration that includes a rigid device backbone that is suspended above and connected to the underlying substrate at multiple locations by compliant structures. The compliant structures isolate substrate deformations from the rigid "backbone" of the transducer. Furthermore, multiple electrical connections can be made to the substrate through the compliant structures. Fabrication methodology entails a dielectric trench refill process to form isolation segments that electrically isolate each section of the suspended backbone and provide a rigid mechanical connection.

Figure 1:
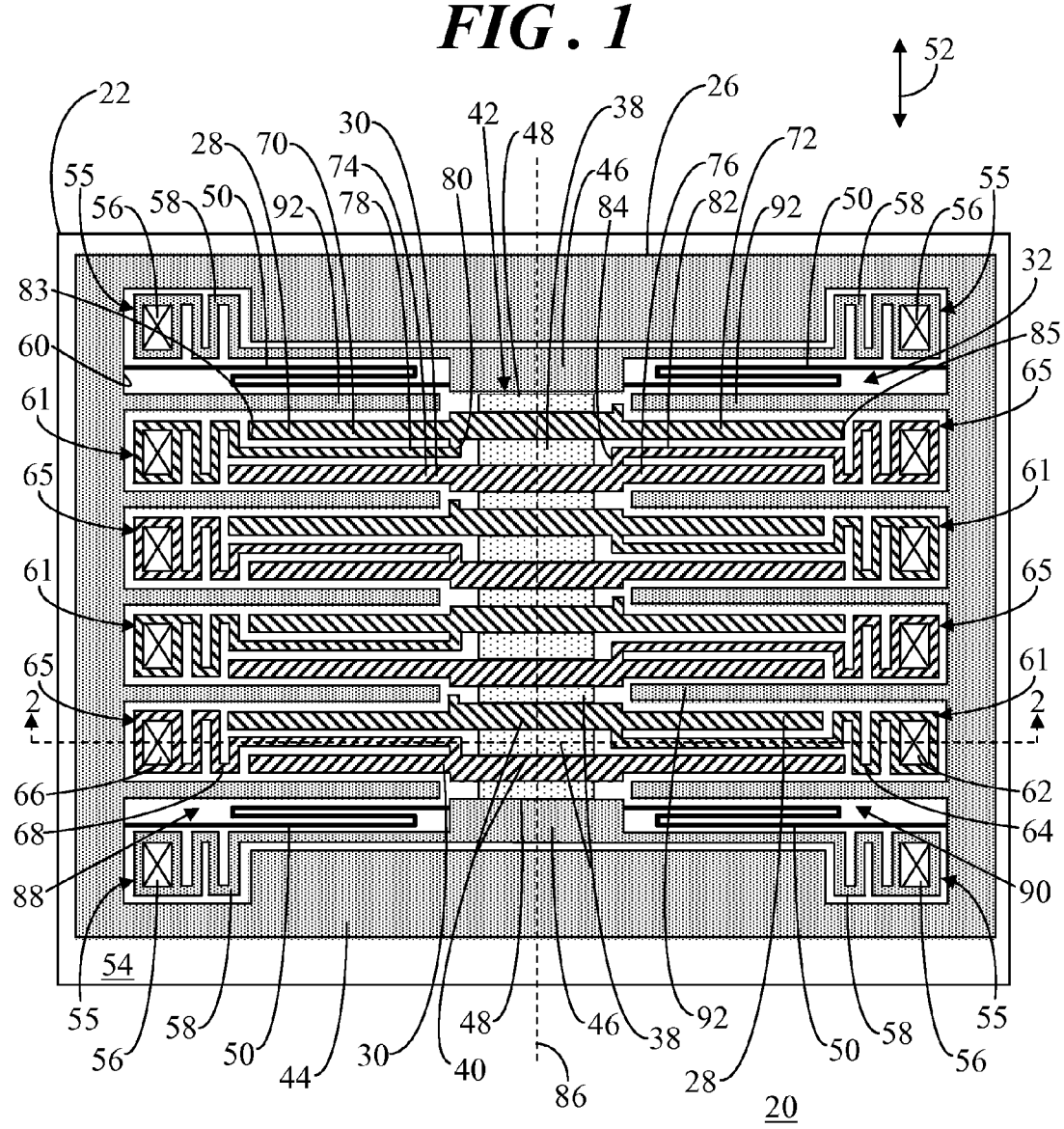
FIG. 1 schematically shows a top view of a microelectromechanical systems (MEMS) device in accordance with an embodiment.
Figure 2:
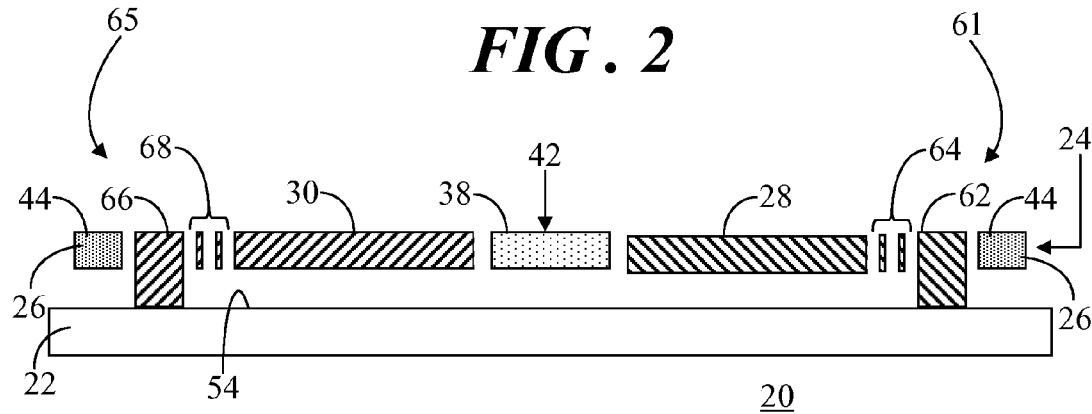
FIG. 2 shows a side view of the MEMS device along section lines 2-2 of FIG. 1.
Figure 3:
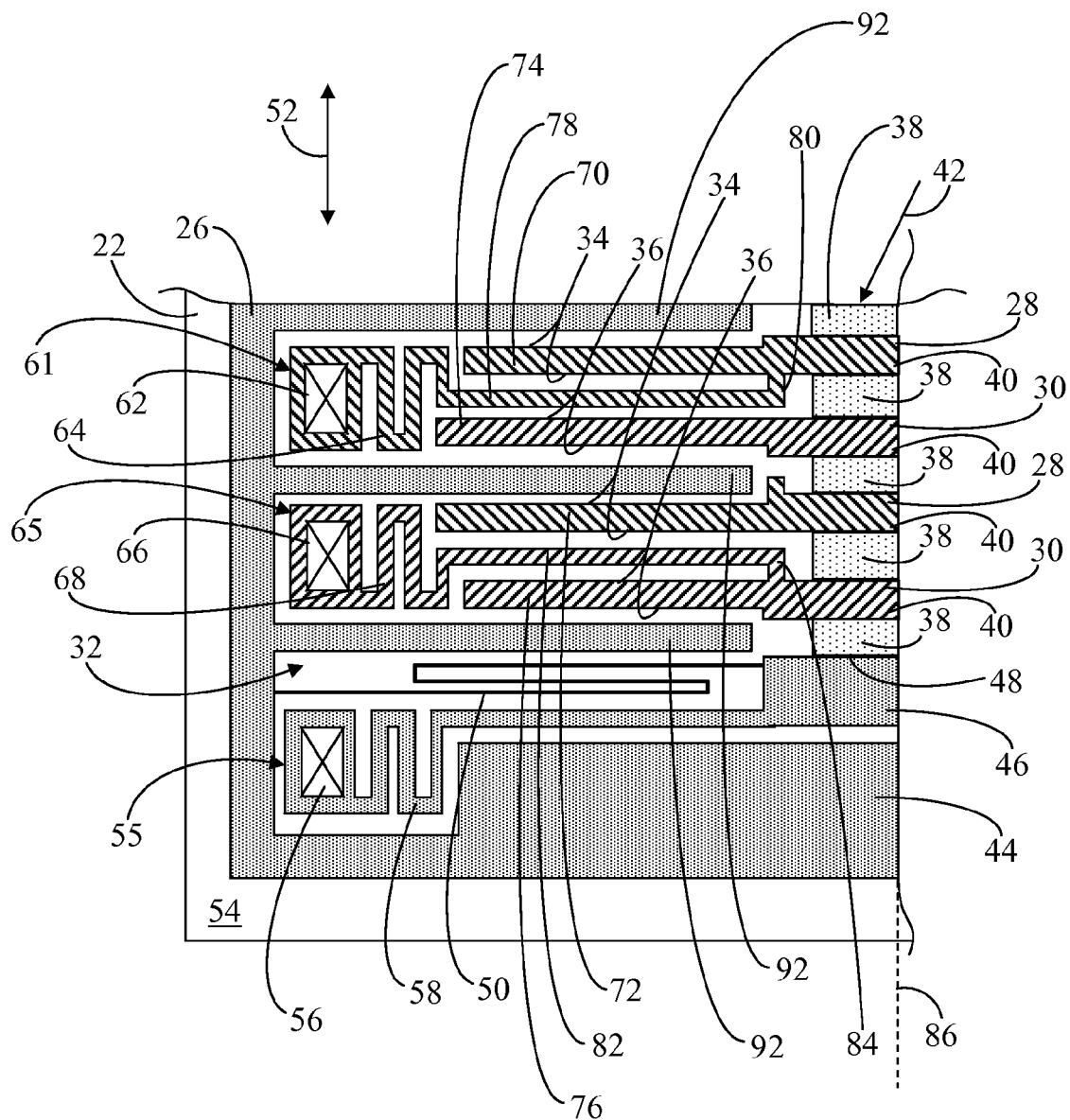
FIG. 3 shows an enlarged partial top view of the MEMS device of FIG. 1.

Referring to FIGS. 1-3, FIG. 1 schematically shows a top view of a microelectromechanical systems (MEMS) device 20 in accordance with an embodiment. FIG. 2 shows a side view of MEMS device 20 along section lines 2-2 of FIG. 1, and FIG. 3 shows an enlarged partial top view of the MEMS device of FIG. 1. FIGS. 1-3 are illustrated using various shading and/or hatching to distinguish the different elements produced within the structural layers of MEMS device 20, as will be discussed below. These different elements within the structural layers may be produced utilizing current and upcoming surface micromachining techniques of depositing, patterning, etching, and so forth. Accordingly, although different shading and/or hatching is utilized in the illustrations, the different elements within the structural layers are typically formed out of the same material, such as polysilicon, single crystal silicon, and the like.

The elements of MEMS device 20 (discussed below) may be described variously as being "attached to," "attached with," "coupled to," "fixed to," or "interconnected with," other elements of MEMS device 20. However, it should be understood that the terms refer to the direct or indirect physical connections of particular elements of MEMS device 20 that occur during their formation through patterning and etching processes of MEMS device fabrication, as will be discussed in connection with FIG. 5.

MEMS device 20 includes a substrate 22 and a device structure 24 (best seen in FIG. 2). A number of elements, or microstructures, are formed as part of device structure 24. In an embodiment, these elements include a proof mass structure 26, a plurality of first beams 28, and a plurality of second beams 30. Proof mass structure 26 is represented by a dark stippled pattern. First beams 28 are represented by downwardly and rightwardly directed wide hatching, and second beams 30 are represented by upwardly and rightwardly directed wide hatching. The terms "first" and "second" used herein do not refer to an ordering or prioritization of elements within a countable series of elements. Rather, the terms "first" and "second" are used to distinguish the two sets of beams 28 and 30 for clarity of discussion.

In the illustrated example, proof mass structure 26 includes a central opening 32 and first and second beams 28 and 30 reside in central opening 32. In some embodiments, first beams 28 are in an alternating arrangement with second beams 30. Accordingly, first and second beams 28 and 30 are oriented such that lengthwise edges 34 of first beams 28 are generally beside adjacent lengthwise edges 36 of second beams 30. Four each of first and second beams 28 and 30 are shown in FIG. 1 for simplicity of illustration. In alternative embodiments, there may be more or less than four of each beam 28 and 30.

MEMS device 20 further includes a plurality of isolation segments 38 extending through device structure 24. Isolation segments 38 are interposed between first and second beams 28 and 30 so that middle portions 40 of adjacent first and second beams 28 and 30 are laterally anchored to the same isolation segment 38. Accordingly, the alternating pattern of first and second beams 28 and 30 anchored to intervening isolations segments 38 forms a rigid backbone 42 of MEMS device 20 suspended above substrate 22. Isolation segments 38 are represented in FIGS. 1-3 by a light stippled pattern.

Proof mass structure 26 includes a movable frame element 44 surrounding first and second beams 28 and 30 and having central opening 32. Proof mass structure 26 further includes suspended anchor sections 46 located at opposing ends 48 of rigid backbone 42. Flexures 50 are interconnected between anchor sections 46 and movable frame element 44. As will be discussed in greater detail below, flexures 50 enable movement of movable frame element 44 relative to suspended anchor sections 46 in a sense direction 52 parallel to a surface 54 of substrate 22.

In an embodiment, middle portions 40 of the endmost ones of first and second beams 28 and 30 in rigid backbone 42 are coupled with proof mass structure 26 via additional isolation segments 38. More particularly, one of isolation segments 38 is located at each of opposing ends 48 of rigid backbone 42, and one each of suspended anchor sections 46 is laterally anchored to one of isolation segments 38 at each of ends 48 so that isolation segments 38 are interposed between first and second beams 28 and 30 and suspended anchor sections 46 of proof mass structure 26.

Isolation segments 38 interposed between first and second beams 28 and 30 and between suspended anchor sections 46 and first and second beams 28 and 30 provide electrical discontinuity (i.e., electrical isolation) between first and second beams 28 and 30 and proof mass structure 26. Fabrication methodology discussed in connection with FIG. 5 includes a dielectric trench refill process to form isolations segments 38 so that first and second beams 28 and 30 and proof mass structure 26 are electrically isolated from another. Additionally, isolation segments 38 provide a rigid mechanical connection between first and second beams 28 and 30 and suspended anchor sections 46 of proof mass structure 26.

Proof mass structure 26, first beams 28, and second beams 30 are suspended above surface 54 of substrate 22 (best seen in FIG. 2) and are configured for attachment with substrate 22 via compliant connections. In particular, MEMS device 20 includes one or more compliant structures 55, each of which includes proof mass anchors 56 coupled with substrate 22 and compliant members 58 coupled between proof mass anchors 56 and suspended anchor sections 46. Thus, proof mass structure 26 is anchored to, but suspended above, substrate 22 via four compliant connections in this example. In some embodiments, compliant members 58 may have much higher stiffness in sense direction 52 than flexures 50, for example, on the order of one or two orders of magnitude higher than the stiffness of flexures 50. As such, it is flexures 50 coupled between anchor sections 46 and an inner perimeter 60 of movable frame element 44 that enable the movement of movable element 44 relative to rigid backbone 42.

MEMS device 20 further includes a first compliant structure 61 that includes first anchors 62 coupled with substrate 22 and first compliant members 64, where each of first compliant members 64 is interconnected between one of first anchors 62 and one of first beams 28. Thus, each of first beams 28 is anchored to, but suspended above, substrate 22 via a compliant connection that includes one of first compliant members 64 and one of first anchors 62. Additionally, MEMS device 20 further includes a second compliant structure 65 that includes second anchors 66 coupled with substrate 22 and second compliant members 68, where each of second compliant members 68 is interconnected between one of second anchors 66 and one of second beams 30. Thus, each of second beams 30 is anchored to, but suspended above, substrate 22 via a compliant connection that includes one of second compliant members 68 and one of second anchors 66.

In FIG. 1, anchors 56, 62, and 66 are represented by "X" marks over their corresponding elements to indicate the multiple connections to substrate 22. Again, the terms "first" and "second" do not refer to an ordering or prioritization of elements within a countable series of elements. Rather, the term "first" is used to associate anchors 62 and compliant members 64 with first beams 28 and the term "second" is used to associate anchors 66 and compliant members 68 with second beams 30 for clarity of discussion.

The multiple compliant connections of proof mass structure 26 via compliant structures 55, first beams 28 via first compliant structures 61, and second beams 30 via second compliant structures 65 largely isolate deformations in substrate 22 from backbone 42. That is, any thermal and/or package stress in MEMS device 20 that is sufficient to cause deformation in substrate 22 can result in the shifting of anchors 56, 62, and 66 relative to one another. However, flexibility of compliant members 58, 64, and 68 largely prevents this shift from causing a commensurate shifting, twisting, or bending of rigid backbone 42. Accordingly, the fixed sense fingers, i.e., segments of first and second beams 28 and 30 extending from opposing sides of middle portions 40, are largely immune to deformations in substrate 22 due to the rigid interconnection of middle portions 40 at backbone 42.

The following discussion applies to a single pair of first and second beams 28 and 30, respectively. However, it should be readily observed that the following discussion applies equally to each pair of first and second beams 28 and 30 of MEMS device 20. In the illustrated embodiment, first beam 28 includes a first segment 70 and a second segment 72, with middle portion 40 of first beam 28 being located between first and second segments 70 and 72, respectively. Likewise, second beam 30 includes a third segment 74 and a fourth segment 76, with middle portion 40 of second beam 30 being located between third and fourth segments 74 and 76, respectively. Isolation segments 38 are absent from the distal segments 70, 72, 74, and 76 so that first segment 70 of first beam 28 is spaced apart, i.e., displaced away, from third segment 74 of second beam 30 and second segment 72 of first beam 28 is spaced apart, i.e., displaced away, from fourth segment 76 of second beam 30.

In accordance with the segment structure of beams 28 and 30, each of first compliant members 64 includes a first elongate portion 78 positioned between first segment 70 of first beam 28 and third segment 74 of second beam 30. Additionally, first elongate portion 78 has a first end 80 coupled to one of first beams 28 proximate middle portion 40 of first beam 28. Likewise, each of second compliant members 68 includes a second elongate portion 82 positioned between second segment 72 of first beam 28 and fourth segment 76 of second beam 30. Additionally, second elongate portion 82 has a second end 84 coupled to one of second beams 30 proximate middle portion 40 of second beam 30. The connection of first and second elongate portions 78 and 82 of first and second compliant members 64 and 68, respectively, proximate middle portions of backbone 42 enhances the package stress isolation features by ensuring that the fixed sense segments 70, 72, 74, and 76 are isolated from deformations in the underlying substrate 22.

It can be further observed in the illustrated embodiment that each of first anchors 62 is coupled with substrate 22 beyond a first beam end 83 of an associated one of first beams 28. Each of second anchors 66 is coupled with substrate 22 beyond a second beam end 85 of an associated one of second beams 30. The structure of first and second beams 28 and 30 with corresponding first and second elongate portions 78 and 82 and the location of first and second anchors 62 and 66 beyond beam ends 83 and 85 of beams 28 and 30 achieves area efficiency for MEMS device 20 while concurrently isolating the suspended structures from deformations in the underlying substrate 22.

In an embodiment, backbone 42 is approximately located at a midline 86 of central opening 32. In general, backbone 42 delineates a first opening section 88 of central opening 32 from a second opening section 90 of central opening 32. Microstructures including first and third segments 70 and 74 for each pair of first and second beams 28 and 30, first anchor 62 and first compliant member 64 are located on one side of midline 86 and second and fourth segments 72 and 76 for the same pair of first and second beams 28 and 30, second anchor 66 and second compliant member 68 are located on the other side of midline 86. Accordingly, for each pair of first and second beams 28 and 30, first compliant structure 61 (which includes first anchor 62 and first compliant member 64) is positioned in one of first and second opening sections 88 and 90, and second compliant structure 65 (which includes second anchor 66 and second compliant member 68) is positioned on the opposing side of middle portion 40 in the other one of first and second opening sections 88 and 90. As particularly shown in FIG. 1, this configuration alternates with each pair of first and second beams 28 and 30 in accordance with the alternating arrangement of first and second beams 28 and 30.

With continued reference to FIG. 1, it should be readily observed that multiple movable sense fingers 92 extend from inner perimeter 60 of movable frame element 44. Sense fingers 92 are positioned on opposing sides of each pair of first and second beams 28 and 30. The arrangement of pairs of first and second beams 28 and 30 and the location of movable sense fingers 92 yields a differential capacitive sensing architecture of MEMS device 20.

Figure 4:
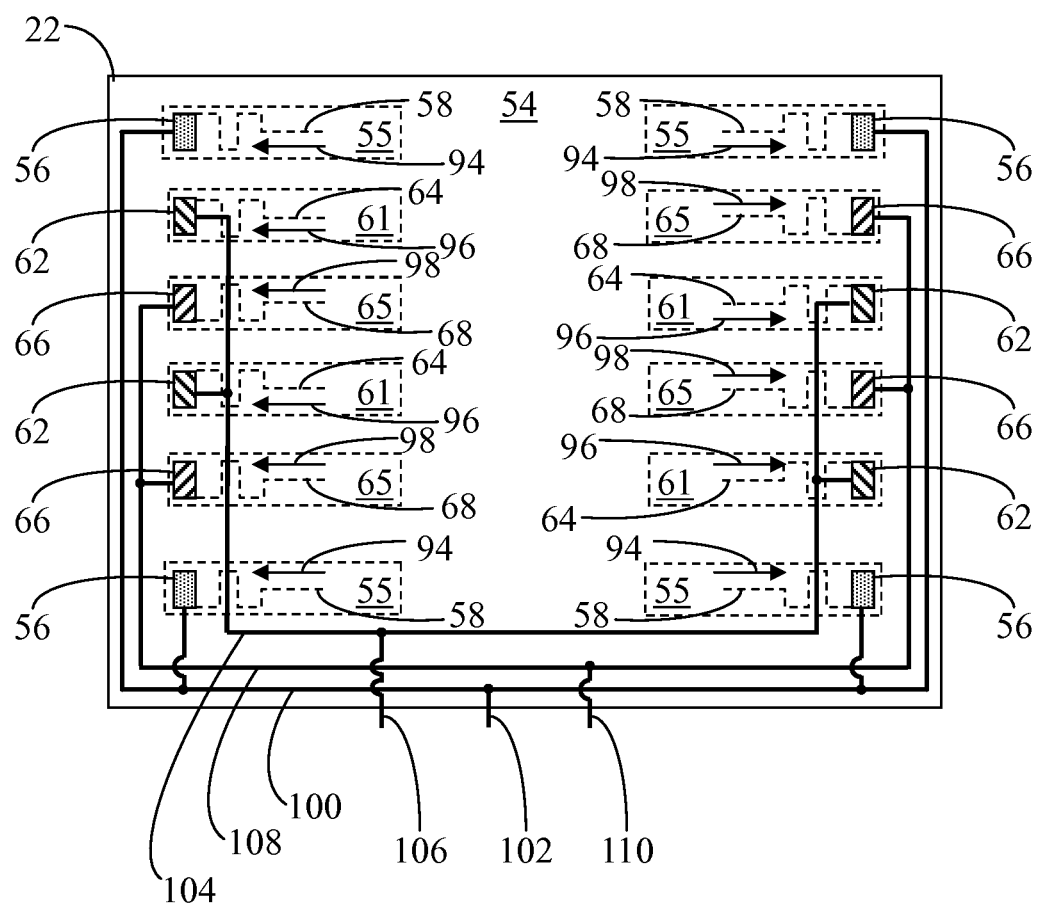
FIG. 4 schematically shows a top view of a substrate on which a device structure of the MEMS device of FIG. 1 may be formed.

Referring now to FIG. 4, FIG. 4 schematically shows a top view of substrate 22 on which device structure 24 (FIG. 1) of MEMS device 20 (FIG. 1) may be formed. It will be recalled that proof mass structure 26, and first and second beams 28 and 30 are suspended over substrate 22 via compliant structures 55, 61, and 65. And, compliant structures 55 include proof mass anchors 56, first compliant structures 61 include first anchors 62, and second compliant structures 65 include second anchors 66. In the example presented in FIG. 4, anchors 56, 62, and 66 are represented by their associated stippled or hatched pattern, and compliant structures 55, 61, 65 and their corresponding compliant members 58, 64, and 68 are represented in dashed line form.

As discussed above, isolation segments 38 provide electrical discontinuity between first and second beams 28 and 30 and proof mass 26. Since first and second beams 28 and 30 and proof mass 26 are electrically isolated from one another by isolation segments 38, it follows that compliant structures 55, 61, and 65 are also electrically isolated from one another. Accordingly, electrical connections can be made through compliant structures 55, 61, and 65 to substrate 22. That is, compliant members 58 and proof mass anchors 56 of compliant structures 55 form electrically conductive paths 94 to substrate 22 for proof mass structure 26 (FIG. 1). First compliant members 64 and first anchors 62 of first compliant structures 61 form first electrically conductive paths 96 to substrate 22 for first beams 28 (FIG. 1). Second compliant members 68 and second anchors 66 of second compliant structures 68 form second electrically conductive paths 98 to substrate 22 for second beams 30 (FIG. 1). Electrically conductive paths 94, 96, and 98 are thus electrically isolated from one another.

In accordance with MEMS device fabrication methodology, discussed below, conductive traces may be formed on surface 54 of substrate 22. For example, conductive traces 100 may interconnect electrically conductive paths 94 to an output 102, conductive traces 104 may interconnect electrically conductive paths 96 to an output 106, and conductive traces 108 may interconnect electrically conductive paths 98 to an output 110. Conductive traces 100, 104, and 108 may be suitably formed on substrate 22 and electrically isolated from one another, as known to those skilled in the art. Accordingly, in addition to achievements in area efficiency for MEMS device 20 while concurrently isolating the suspended structures from deformations in the underlying substrate 22, as discussed above, the inclusion of isolation segments 38 enables effective electrical routing.

Referring briefly to FIG. 1, in the illustrated embodiment, MEMS device 20 may be an accelerometer having capacitive sensing capability. In general, flexures 50 suspend movable frame element 44 of proof mass structure 26 over substrate 22 in a neutral position parallel to substrate 22 until the selective application of force, due to some other means, causes a deflection thereof. By way of example, movable frame element 44 of MEMS device 20 moves when MEMS device 20 experiences acceleration in sense direction 52. Lateral movement of movable sense fingers 92 extending from movable frame element 44 may be detected by first and second fixed beams 28 and 30 interleaved with sense fingers 92, as known to those skilled in the art. This lateral movement can subsequently be converted via electronics (not shown) into a signal having a parameter magnitude (e.g. voltage, current, frequency, etc.) that is dependent on the acceleration. In an example, compliant members 58, 64, and 68 may have a stiffness that is on the order of one to two times greater than the stiffness of flexures 50 so that first and second beams 28 and 30 are fixed, i.e., are largely immovable, relative to movable frame element 44 in response to the selective application of force.

As discussed above, stress from packaging of a MEMS device and/or its solder connection to an underlying printed circuit board can cause deformations or displacements in the substrate that lead to sensor inaccuracy. Furthermore, the strain profile of the substrate 22 may be inconsistent across the plane of substrate 22. In MEMS device 20, the adverse affects of an inconsistent strain profile are mitigated by the suspended configuration of proof mass structure 26, and first and second beams 28 and 30 over substrate 22 via compliant structures 55, 61, and 65. An embodiment described above entails a single axis accelerometer, e.g., MEMS device 20, for detection of lateral movement in sense direction 52. However, alternative embodiments may entail dual axis accelerometers or other MEMS sensing devices where the suspended microstructures are isolated from substrate deformation via the compliant structures described above.

Figure 5:
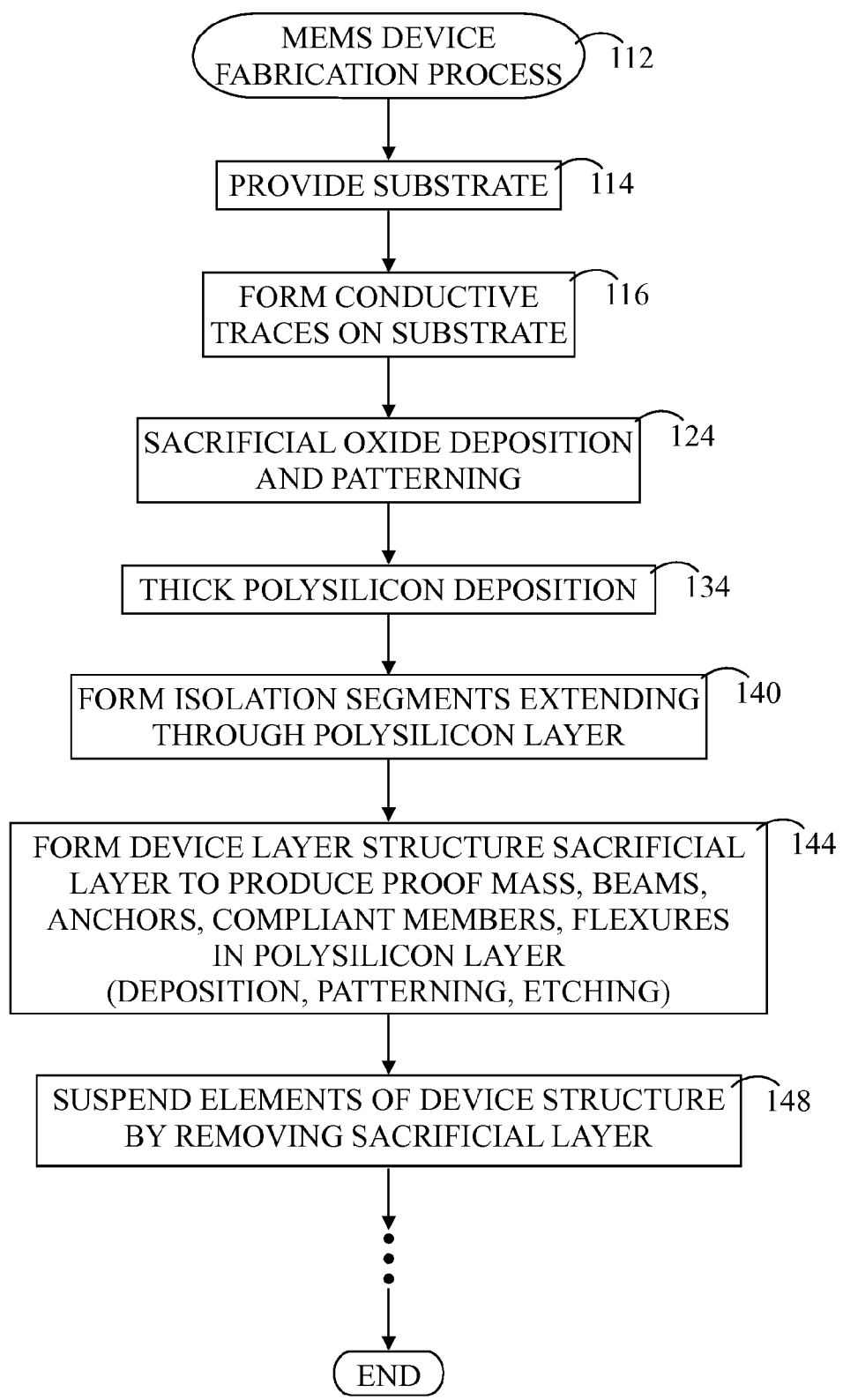
FIG. 5 shows a flowchart of a MEMS device fabrication process in accordance with another embodiment.

FIG. 5 shows a flowchart of a MEMS device fabrication process 112 in accordance with another embodiment. MEMS device fabrication process 112 provides methodology for fabricating a MEMS device that is largely separated from an underlying substrate through the suspension of microstructures above the substrate via compliant structures. In an embodiment, fabrication process 112 takes advantage of surface micromachining techniques to produce MEMS device 20 having isolation segments 38 (FIG. 1). Process 112 will be discussed in connection with the fabrication of MEMS device 20 (FIG. 1). However, it should become apparent that the following methodology can be adapted to fabricate other MEMS device designs in which stress isolation for improved device performance is desired. The operations of fabrication process 112 will be discussed in connection with FIGS. 6-12 which show schematic cross-sectional views illustrating operations of MEMS device fabrication process 112. As such, throughout discussion of the operations of fabrication process 112 reference will be made to particular ones of FIGS. 6-12.

MEMS device fabrication process 112 begins with a task 114. At task 114, substrate 22 is provided. In an embodiment, substrate 22 may be a silicon wafer. In alternative embodiments, substrate 22 may be glass, plastic, or any other suitable material. The following operations of fabrication process 112 describe operations for fabricating a single MEMS device 20 for simplicity of illustration. However, it should be understood by those skilled in the art that the following process allows for concurrent manufacturing of a plurality of MEMS devices 20. For example, multiple MEMS devices 20 may undergo concurrent semiconductor thin-film manufacturing on substrate 22. The individual MEMS devices 20 can then be cut, or diced, in a conventional manner to provide individual MEMS devices 20 that each can be packaged and coupled onto a printed circuit board in an end application.

The provision of substrate 22 at task 114 may further entail various surface preparation processes. By way of example, surface preparation of substrate 22 may entail surface cleaning, performing a thermal oxidation process to form an oxide pad, nitride deposition and patterning, performing a thermal field oxidation process to produce a field oxide layer, and so forth as known to those skilled in the art. For brevity, these process will not be described in detail herein.

Following task 114, a task 116 is performed. At task 116, conductive traces 100, 104, 108 (FIG. 4) are formed on the prepared surface 54 (FIG. 1) of substrate 22.

Figure 6:
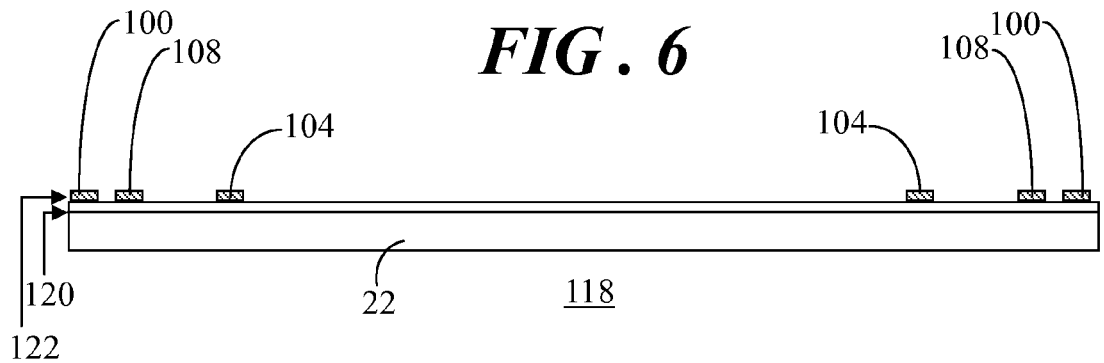
FIG. 6 shows a side view of the MEMS device of FIG. 1 in a beginning stage of processing.

Referring to FIG. 6, FIG. 6 shows a side view of MEMS device 20 (FIG. 1) in a beginning stage 118 of processing in accordance with tasks 114 and 116. At beginning stage 118, a surface preparation layer 120 on surface 54 of substrate 22 may include oxide pad(s), a nitride layer, and/or a field oxide layer in accordance with task 114. These various layers within surface preparation layer 120 are not distinguished in FIG. 6 for simplicity of illustration.

A polysilicon layer 122 is deposited on surface preparation layer 120 and is patterned. Polysilicon layer 122 may be patterned using, for example, a photolithographic process, and etched using, for example, reactive ion etching (RIE), to produce a patterned polysilicon layer. A high conductivity may be desired for polysilicon layer 122 in some embodiments. Hence, polysilicon layer 122 may be doped over the entire surface area, or may otherwise be made highly conductive. After patterning and etching, polysilicon layer 122 can yield polysilicon conductor regions, e.g., conductive traces 100, 104, 108.

Figure 7:
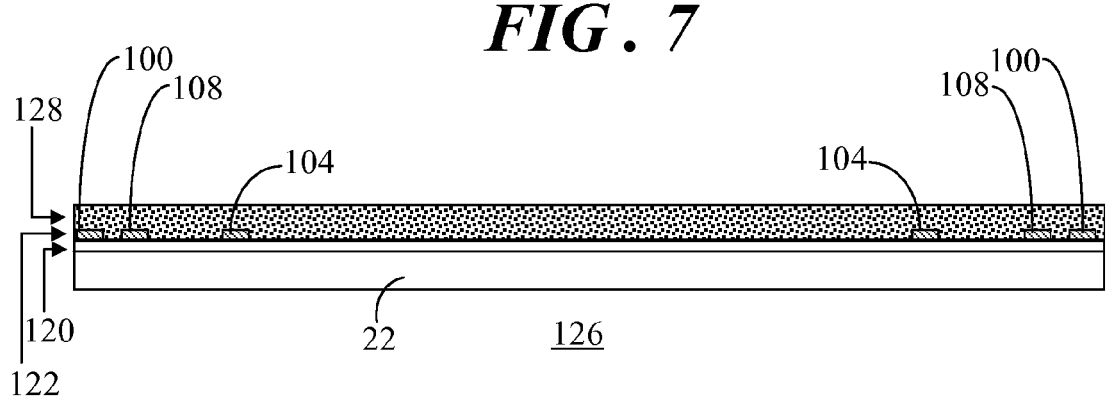
FIG. 7 shows a side view of the device of FIG. 6 in a subsequent stage of processing.
Figure 8:
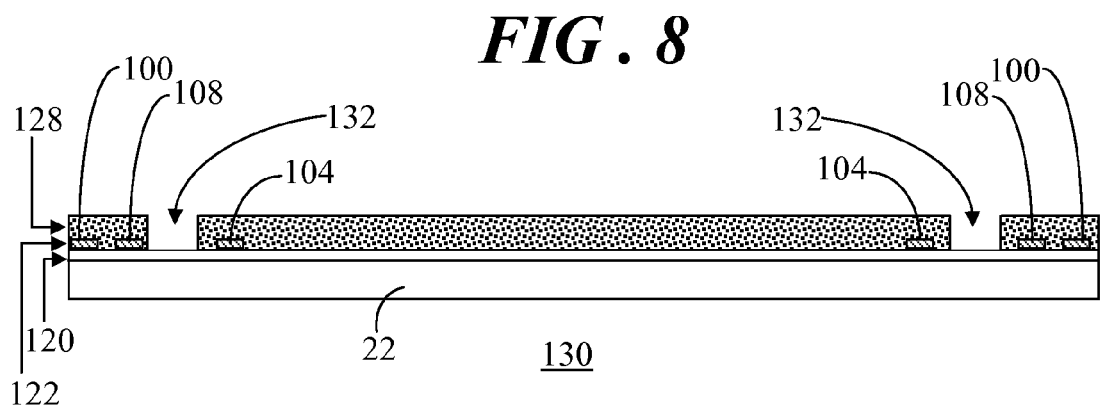
FIG. 8 shows a side view of the device of FIG. 7 in a subsequent stage of processing.

Referring back to FIG. 5, following task 116, MEMS device fabrication process 112 continues with a task 124. At task 124, a sacrificial oxide is deposited and patterned. FIGS. 7 and 8 illustrate operations occurring at task 124 of fabrication process 112.

FIG. 7 shows a side view of the device of FIG. 6 in a subsequent stage 126 of processing. At stage 126, a sacrificial oxide layer 128 is deposited over surface preparation layer 120 and polysilicon layer 122 containing conductive traces 100, 104, and 108. In some embodiments, sacrificial oxide layer 128 may be formed using a single layer deposition and patterning technique. In other embodiments, sacrificial oxide layer 128 may be formed using a two layer sacrificial oxide deposition process. The particular process implemented for the deposition of sacrificial oxide layer 128 is not a limitation.

FIG. 8 shows a side view of the device of FIG. 7 in a subsequent stage 130 of processing. At stage 130, sacrificial oxide layer 128 may be suitably patterned using photolithography and oxide reactive ion etching (RIE). In an example, sacrificial oxide layer 128 may be etched to produce openings 132 extending through sacrificial oxide layer 128 in which anchors 56, 62, and 66 may subsequently be formed.

Referring back to FIG. 5, following sacrificial oxide deposition and patterning at task 124, fabrication process 112 continues with a task 134. At task 134, thick polysilicon deposition is performed.

Figure 9:
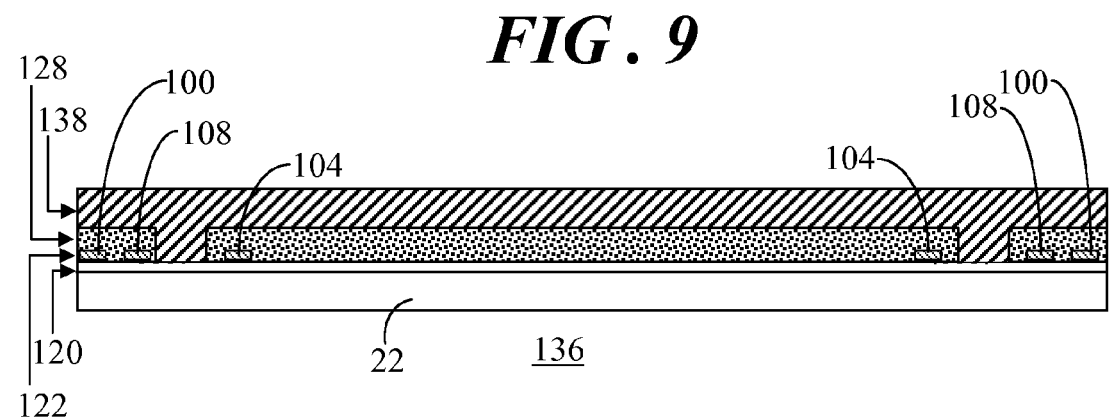
FIG. 9 shows a side view of the device of FIG. 8 in a subsequent stage of processing.

With reference to FIG. 9 in connection with task 134, FIG. 9 shows a side view of the device of FIG. 8 in a subsequent stage 136 of processing. Polysilicon is formed overlying the various structures previously built up on substrate to form a polysilicon structural layer 138. It will be observed in FIG. 9, as well as in the ensuing FIGS. 10-12, that polysilicon structural layer 138 is represented by a single pattern, in particular, rightwardly and upwardly directed wide hatching for simplicity of the following illustrations and to emphasize that the particular microstructures to be produced in polysilicon structural layer 138 are all formed from the same material.

Polysilicon structural layer 138 may be formed using various known and upcoming processes for thick film deposition. In one example, a polysilicon starting, or seed, layer may be deposited over a surface of the structure shown in FIG. 9 at a thickness of approximately one hundred to three hundred nanometers. A thick silicon layer may then be deposited over the polysilicon starting layer in another process step at a thickness of approximately 22,000 to 28,000 nanometers to yield polysilicon structural layer 138. Polysilicon structural layer 138 may have a rough surface after deposition, and may subsequently be planarized using, for example, a chemical-mechanical polishing process. Following planarization, polysilicon structural layer 138 will have a finished height determined by the application and desired sensitivity.

Referring back to FIG. 5, following task 134, MEMS device fabrication process 112 continues with a task 140. At task 140, isolation segments 38 (FIG. 1) are formed in polysilicon structural layer 138 (FIG. 9). In general, the formation of isolation segments 38 involves etching a pattern of trenches in polysilicon structural layer 138 using, for example, polysilicon deep reactive-ion etching (DRIE). The entire thickness of polysilicon structural layer 138 is etched through to expose an underlying portion of sacrificial oxide layer 128. Next, one or more deposition processes are performed to fill the trenches with one or more dielectric materials (such as nitride, a silicon-rich nitride, silicon dioxide, and so forth). Following deposition, any excess dielectric can be removed using a technique such as chemical-mechanical planarization.

Figure 10:
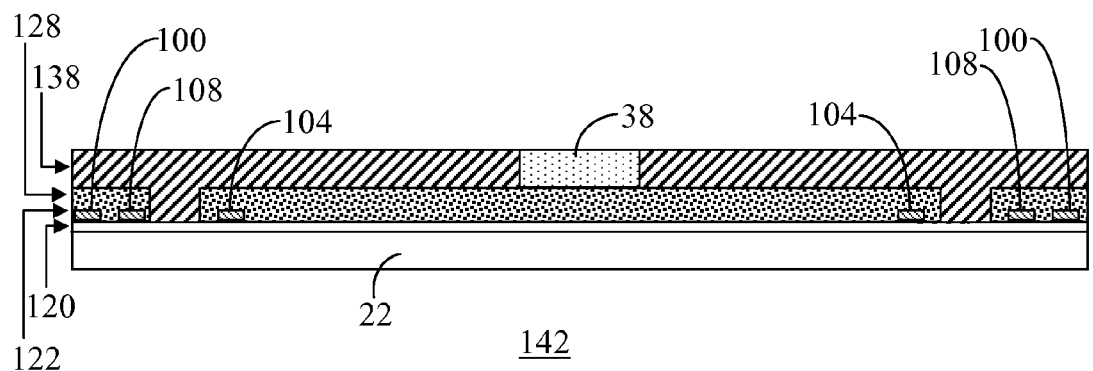
FIG. 10 shows a side view of the device of FIG. 9 in a subsequent stage of processing.

With reference to FIG. 10 in connection with task 140, FIG. 10 shows a side view of the device of FIG. 9 in a subsequent stage 142 of processing. At stage 142, trenches have been formed in polysilicon structural layer 138 and filled with dielectric material to yield isolation segments 38, of which only one is visible.

Referring back to FIG. 5, following task 140, a task 144 is performed. At task 144, proof mass structure 26 (FIG. 1), beams 28 and 30 (FIG. 1), and the associated compliant structures 55, 61, and 65 (FIG. 1) are formed in polysilicon structural layer 138.

Figure 11:
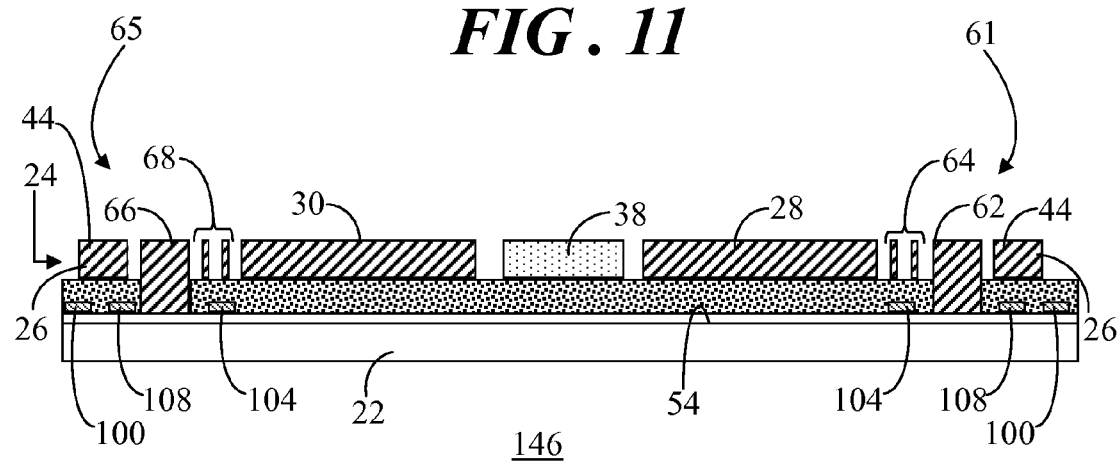
FIG. 11 shows a side view of the device of FIG. 10 in a subsequent stage of processing.

Referring to FIG. 11 in connection with task 144, FIG. 11 shows a side view of the device of FIG. 6 in a subsequent stage 146 of processing. At stage 146, polysilicon structural layer 138 (FIG. 10) has been patterned and etched to produce device structure 24 that includes proof mass structure 26, beams 28 and 30, flexures 50 (FIG. 1), and compliant members 58, 64, and 68 of the associated compliant structures 55, 61, and 65. In addition, the deposition of polysilicon structural layer 138 at task 134 (FIG. 5) into openings 132 (FIG. 8) fills openings 132 so that following the forming task 144, anchors 56, 62, and 66 are also produced. Patterning and etching process techniques yield isolation segments 38 that physically separate elements 26, 28, and 30 from one another. Again, the various elements produced in device structure 24 shown in FIG. 11 are not distinguished from one another. Rather, the single rightwardly and upwardly directed wide hatch pattern is utilized to represent device structure 24.

With reference back to MEMS device fabrication process 112 (FIG. 5), following task 144, a task 148 is performed. At task 148, the elements in device structure 24 are suspended over substrate 22 by removing sacrificial oxide layer 128 by employing, for example, an etching technique.

Figure 12:
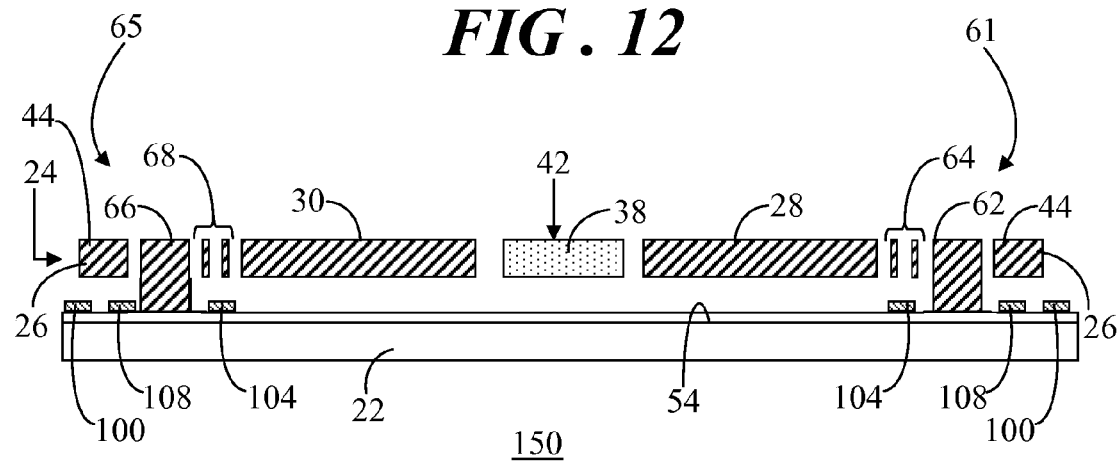
FIG. 12 shows a side view of the device of FIG. 11 at a final stage of processing.

Referring to FIG. 12 in connection with task 124, FIG. 12 shows a side view of the device of FIG. 11 in a subsequent stage 150 of processing. At stage 150, sacrificial oxide layer 128 has been etched using known processes to release proof mass structure 26, first and second beams 28 and 30 including rigid backbone 42 (FIG. 1), flexures 50 (FIG. 1), and compliant members 58, 64, 68 from the underlying substrate 22. FIG. 12 generally represents the side view of MEMS device 20 along section line 2-2 of FIG. 1 as also shown in FIG. 2. However, like the previous processing illustrations of FIGS. 9-11, the various elements produced in device structure 24 are not distinguished from one another in FIG. 12. Rather, these various elements can be readily ascertained from FIG. 2.

In an embodiment, the etching of sacrificial oxide layer 128 (FIG. 11) at task 148 removes substantially an entirety of sacrificial oxide layer 128 so that proof mass structure 26, first and second beams 28 and 30 including rigid backbone 42, flexures 50 (FIG. 1), and compliant members 58, 64, 68 are spaced apart from the underlying substrate 22 with the exception of anchors 56, 62, and 66.

The selective removal of sacrificial oxide layer 128 can be achieved by making certain regions of device structure 24 porous to an etch material, or etchant. This porosity may be accomplished by fabricating device structure 24 with through-holes (not shown for simplicity of illustration). The through-holes can provide passage through which an etchant can pass to reach the underlying sacrificial oxide layer 128. This porosity may alternatively be accomplished by the properties of the material used to fabricate device structure 24. For example, the properties of the material used to fabricate device structure 24 may be such that the etchant can permeate through the material of device structure 24 to reach the underlying sacrificial oxide layer 128 without damage to device structure 24.

With reference back to MEMS device fabrication process 112 (FIG. 5), following task 148, MEMS device fabrication process 112 may include other activities that are not discussed herein for brevity. These additional fabrication activities, represented by ellipses, may include hermetically sealing MEMS device 20, forming electrical interconnects, and so forth. Following fabrication of MEMS device 20, fabrication process 112 ends following formation of a MEMS device having a number of microstructures.

The microstructures formed in accordance with the fabrication process include a proof mass structure, a first beam, and a second beam formed in a device structure on a sacrificial layer overlying a substrate, where the proof mass structure has a central opening, and the first and second beams reside in the central opening and are oriented such that lengthwise edges of the first and second beams are beside one another. Additionally, the microstructures formed in accordance with fabrication process include a first anchor and a first compliant member interconnected between the first anchor and the first beam in the device structure, and a second anchor and a second compliant member interconnected between the second anchor and the second beam in the device structure. The microstructures formed in accordance with fabrication process further include proof mass anchors and third compliant members interconnected between the proof mass anchors and suspended anchor sections of the proof mass structure in the device structure, and flexures formed in the device structure between the suspended anchor sections and a movable element of the proof mass structure. Finally, the microstructures formed in accordance with fabrication process include isolation segments formed in the device structure interposed between the first and second beams, wherein a middle portion of each of the first and second beams is laterally anchored to at least one isolation segment, and the middle portion of the each of the first and second beams is coupled with the suspended anchor sections of the proof mass structure via additional isolation segments. The isolation segments provide electrical discontinuity between the first and second beams and the proof mass structure.

The fabrication process ends following suspension of the proof mass structure, the first and second beams, the flexures, and the compliant members over the substrate by removing at least a portion of the sacrificial layer. Accordingly, execution of the MEMS device fabrication process yields a MEMS device in which the first anchor and the first compliant member form a first electrically conductive path for the first beam. The second anchor and the second compliant member form a second electrically conductive path for the second beam. The proof mass anchors and third compliant members form a third electrically conductive path for the proof mass, and the first, second, and third electrically conductive paths are electrically isolated from one another. The flexures enable movement of the movable element of the proof mass structure in a sense direction parallel to the surface, and the first, second, and third compliant members are stiffer than the flexures so that the first and second beams are largely immovable relative to the movable element.

The MEMS device and methodology are implemented to yield a MEMS device that is largely separated from the underlying substrate. This separation is achieved by a configuration that includes a rigid device "backbone" that is suspended above and connected to the underlying substrate at multiple locations by compliant structures. The compliant structures isolate the suspended structures extending from the rigid backbone of the transducer from deformations in the underlying substrate in a space efficient form factor. Furthermore, multiple electrical connections can be made to the substrate through the compliant structures. The fabrication methodology includes a dielectric trench refill process to form isolation segments that electrically isolate each section of the suspended backbone and provide a rigid mechanical connection.

Although a particular MEMS device architecture is described in conjunction with FIGS. 1-5, embodiments may be implemented in MEMS devices having other architectures as well. Furthermore, certain process blocks described in connection with the MEMS device fabrication methodology may be performed in parallel with each other or with performing other processes, and/or the particular ordering of the process blocks may be modified, while achieving substantially the same result. These and other such variations are intended to be included within the scope of the inventive subject matter.

While the principles of the inventive subject matter have been described above in connection with specific apparatus and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A microelectromechanical systems (MEMS) device comprising:
    a substrate;
    a device structure suspended over a surface of said substrate, said device structure including a proof mass structure, a first beam, and a second beam, said first and second beams being oriented such that lengthwise edges of said first and second beams are beside one another; and
    at least one isolation segment suspended over said surface and interposed between said first and second beams, wherein a middle portion of each of said first and second beams is laterally anchored to said at least one isolation segment, and said at least one isolation segment provides electrical isolation between said first and second beams.

2. A MEMS device as claimed in claim 1 further comprising additional isolation segments providing interconnection of said first and second beams with said proof mass structure and providing electrical isolation between said first and second beams and said proof mass structure.

3. A MEMS device as claimed in claim 2 wherein:
    said proof mass structure comprises suspended anchor sections laterally anchored to said additional isolation segments; and
    said MEMS device further comprises proof mass anchors coupled with said substrate and compliant members interconnected between said proof mass anchors and said suspended anchor sections of said proof mass structure.

4. A MEMS device as claimed in claim 3 wherein said proof mass structure further comprises a movable element and flexures interconnected between said suspended anchor sections and said movable element, said flexures enabling movement of said movable element relative to said suspended anchor sections in a sense direction parallel to said surface of said substrate.

5. A MEMS device as claimed in claim 1 further comprising:
    a first compliant structure coupled between said substrate and said first beam; and
    a second compliant structure coupled between said substrate and said second beam.

6. A MEMS device as claimed in claim 5 wherein:
    said first compliant structure includes a first compliant member having a first end coupled to said first beam proximate said middle portion of said first beam; and
    said second compliant structure includes a second compliant member having a second end coupled to said second beam proximate said middle portion of said second beam.

7. A MEMS device as claimed in claim 6 wherein:
    said first beam includes a first segment and a second segment, said middle portion of said first beam being located between said first and second segments;
    said second beam includes a third segment and a fourth segment, said middle portion of said second beam being located between said third and fourth segments;
    said first compliant member includes a first elongate portion having said first end, said first elongate portion positioned between said first and third segments; and
    said second compliant member includes a second elongate portion having said second end, said second elongate portion positioned between said second and fourth segments.

8. A MEMS device as claimed in claim 5 wherein:
    said first compliant structure forms a first electrically conductive path to said substrate for said first beam; and
    said second compliant structure forms a second electrically conductive path to said substrate for said second beam, said second electrically conductive path being electrically isolated from said first electrically conductive path.

9. A MEMS device as claimed in claim 5 wherein:
    said first compliant structure includes a first anchor coupled with said substrate beyond a first distal end of said first beam; and
    said second compliant structure includes a second anchor coupled with said substrate beyond a second distal end of said second beam.

10. A MEMS device as claimed in claim 5 wherein:
    said proof mass structure includes a central opening;
    said first and second beams reside in said central opening;
    said at least one isolation segment and said middle portion of said each of said first and second beams delineate a first opening section of said central opening from a second opening section of said central opening;

said first compliant structure includes a first anchor coupled to said substrate and positioned in said first opening section; and said second compliant structure includes a second anchor coupled to said substrate and positioned in said second opening section such that said first and second anchors are located on opposing sides of said middle portion.

11. A MEMS device as claimed in claim 1 wherein a movable element of said proof mass structure is configured to move in a sense direction parallel to said surface of said substrate and interconnection of said at least one isolation segment with said middle portion of said each of said first and second beams forms a rigid suspended backbone of said MEMS device such that said first and second beams are substantially nonmovable relative to said movable element.

12. A MEMS device as claimed in claim 1 further comprising:
a first plurality of beams, said first plurality of beams including said first beam;
a second plurality of beams, said second plurality of beams including said second beam, said beams of said first plurality of beams being in an alternating arrangement with said beams of said second plurality of beams; and
a plurality of isolation segments in said device structure, one each of said isolation segments of said plurality of isolation segments being interposed between and interconnected with adjacent ones of said beams of said first and second pluralities of beams to form a rigid suspended backbone of said MEMS device.

13. A MEMS device as claimed in claim 1 wherein said at least one isolation segment is absent from distal segments of said first and second beams such that said distal segments of said first and second beams are spaced apart from one another.

14. A microelectromechanical systems (MEMS) device comprising:
a substrate;
a device structure suspended over a surface of said substrate, said device structure including a proof mass structure, a first beam, and a second beam, said first and second beams being oriented such that lengthwise edges of said first and second beams are beside one another;
a first compliant structure interconnected between said substrate and said first beam;
a second compliant structure interconnected between said substrate and said second beam;
a plurality of isolation segments suspended over said surface, wherein at least one isolation segment of said plurality of isolation segments is interposed between said first and second beams such that a middle portion of each of said first and second beams is laterally anchored to said at least one isolation segment, additional isolation segments of said plurality of isolation segments provide interconnection of said first and second beams with said proof mass structure, and said plurality of isolation segments provide electrical isolation between said first beam, said second beam, and said proof mass structure.

15. A MEMS device as claimed in claim 14 further comprising:
a first plurality of beams, said first plurality of beams including said first beam;
a second plurality of second beams, said second plurality of beams including said second beam, said beams of said first plurality of beams being in an alternating arrangement with said beams of said second plurality of beams, wherein said isolation segments of said plurality of isolation segments are interposed between and interconnected with adjacent ones of said first and second beams of said first and second pluralities to form a rigid suspended backbone of said MEMS device.

16. A MEMS device as claimed in claim 14 wherein:
said proof mass structure comprises suspended anchor sections laterally anchored to said additional isolation segments of said plurality of isolation segments, a movable element, and flexures interconnected between said suspended anchor sections and said movable element, said flexures enabling movement of said movable element relative to said suspended anchor sections in a sense direction parallel to said surface of said substrate; and
said MEMS device further comprises third compliant structures interconnected between said substrate and said suspended anchor sections of said proof mass structure, said third compliant structures including compliant members having a stiffness in said sense direction that is greater than a stiffness of said flexures.

17. A MEMS device as claimed in claim 14 wherein:
said first beam includes a first segment and a second segment, said middle portion of said first beam being located between said first and second segments;
said second beam includes a third segment and a fourth segment, said middle portion of said second beam being located between said third and fourth segments;
said first compliant structure includes a first compliant member having a first elongate portion positioned between said first and third segments, said first elongate portion including a first end coupled to said first beam proximate said middle portion;
said second compliant structure includes a second compliant member having a second elongate portion positioned between said second and fourth segments, said second elongate portion including a second end coupled to said second beam proximate said middle portion.

18. A MEMS device as claimed in claim 14 wherein:
said proof mass structure includes a central opening;
said first and second beams reside in said central opening;
said at least one isolation segment and said middle portion of said each of said first and second beams delineate a first opening section of said central opening from a second opening section of said central opening;
said first compliant structure includes a first anchor coupled to said substrate and positioned in said first opening section; and
said second compliant structure includes a second anchor coupled to said substrate and positioned in said second opening section such that said first and second anchors are located on opposing sides of said middle portion.

19. A microelectromechanical systems (MEMS) device comprising:
a substrate;
a device structure suspended over a surface of said substrate, said device structure including a proof mass structure, a first plurality of beams, and a second plurality of beams, said beams of said first and second pluralities of beams being oriented such that lengthwise edges of said first and second pluralities of beams are beside one another, and said beams of said first plurality of beams are in an alternating arrangement with said beams of said second plurality of beams; and
a plurality of isolation segments in said device structure, said isolation segments being suspended over said surface, one each of said isolation segments of said plurality of isolation segments being interposed between and laterally anchored with adjacent ones of said beams of said first and second pluralities of beams to form a rigid suspended backbone of said MEMS device, wherein a middle portion of each of said beams of said first and second pluralities of beams is laterally anchored to said isolation segments, said isolation segments are absent from distal segments of said beams of said first and second pluralities of beams such that said beams of said first and second pluralities of beams are spaced apart from one another, and said isolation segments provide electrical isolation between said beams.

20. A MEMS device as claimed in claim 19 further comprising:
   first compliant structures coupled between said substrate and said beams of said first plurality of beams, said first compliant structures forming first electrically conductive paths to said substrate for said beams of said first plurality of beams; and
   second compliant structures coupled between said substrate and said beams of said second plurality of beams, said second compliant structures forming second electrically conductive paths to said substrate for said beams of said second plurality of beams.

* * * * *